(12) United States Patent
Tsuji et al.

(10) Patent No.: US 9,431,624 B2
(45) Date of Patent: Aug. 30, 2016

(54) ORGANIC ELECTROLUMINESCENT ELEMENT

(71) Applicant: PANASONIC INTELLECTUAL PROPERTY MANAGEMENT CO., LTD., Osaka (JP)

(72) Inventors: Hiroya Tsuji, Kyoto (JP); Satoshi Okutani, Osaka (JP); Satoshi Ohara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/413,896

(22) PCT Filed: Jul. 8, 2013

(86) PCT No.: PCT/JP2013/004218
§ 371 (c)(1),
(2) Date: Jan. 9, 2015

(87) PCT Pub. No.: WO2014/010223
PCT Pub. Date: Jan. 16, 2014

(65) Prior Publication Data
US 2015/0207092 A1 Jul. 23, 2015

(30) Foreign Application Priority Data
Jul. 13, 2012 (JP) .................. 2012-157500

(51) Int. Cl.
| *H01L 51/50* | (2006.01) |
| *H01L 51/52* | (2006.01) |
| *H01L 27/32* | (2006.01) |
| *C09K 11/06* | (2006.01) |

(52) U.S. Cl.
CPC ............ *H01L 51/504* (2013.01); *C09K 11/06* (2013.01); *H01L 27/3209* (2013.01);
(Continued)

(58) Field of Classification Search
CPC ............... H01L 2251/558; H01L 27/3209; H01L 51/504; H01L 51/5044; H01L 51/2562; H01L 51/5268; H01L 51/5275; H01L 51/5278
See application file for complete search history.

(56) References Cited

U.S. PATENT DOCUMENTS

| 8,926,110 B2 | 1/2015 | Tsukitani et al. |
| 2004/0195962 A1* | 10/2004 | Nakamura .......... H01L 51/5262 313/504 |

(Continued)

FOREIGN PATENT DOCUMENTS

| JP | 2004-296423 | 10/2004 |
| JP | 2005-85549 | 3/2005 |

(Continued)

OTHER PUBLICATIONS

Search report from International Patent Appl. No. PCT/JP2013/004218, mail date is Oct. 22, 2013.

*Primary Examiner* — Raj R Gupta
(74) *Attorney, Agent, or Firm* — Greenblum & Bernstein, P.L.C.

(57) ABSTRACT

An organic electroluminescent element includes electrodes and organic light-emitting layers that are between the electrodes. The organic light-emitting layers contain at least three colors of luminescent materials. A first luminescent material has a maximum light emission wavelength within a range of 430 nm to 480 nm. A second luminescent material has a maximum light emission wavelength within a range of 510 nm to 610 nm. A third luminescent material has a maximum light emission wavelength within a range of 580 nm to 630 nm. An average value of average color rendering indexes in a wide angle region of 30° to 60° with respect to a front direction of a light emission surface is higher than an average color rendering index in the front direction.

7 Claims, 3 Drawing Sheets

(52) U.S. Cl.
CPC ...... *H01L 51/5044* (2013.01); *H01L 51/5206* (2013.01); *H01L 51/5221* (2013.01); *H01L 51/5262* (2013.01); *C09K 2211/1011* (2013.01); *C09K 2211/1014* (2013.01); *C09K 2211/1029* (2013.01); *C09K 2211/185* (2013.01); *H01L 51/5268* (2013.01); *H01L 51/5275* (2013.01); *H01L 51/5278* (2013.01); *H01L 2251/558* (2013.01)

(56) References Cited

U.S. PATENT DOCUMENTS

| | | |
|---|---|---|
| 2006/0163999 A1 | 7/2006 | Murazaki et al. |
| 2012/0248424 A1* | 10/2012 | Sasaki ................. H01L 51/504 257/40 |
| 2014/0008629 A1 | 1/2014 | Tsuji et al. |
| 2014/0008632 A1 | 1/2014 | Kuzuoka et al. |

FOREIGN PATENT DOCUMENTS

| | | | |
|---|---|---|---|
| JP | 2005-85895 | 3/2005 | |
| JP | 2006-287154 | 10/2006 | |
| JP | 2009-224274 | 10/2009 | |
| JP | 2011-70963 | 4/2011 | |
| WO | 02/086978 | 10/2002 | |
| WO | WO 2011037209 A1 * | 3/2011 | ........... H01L 51/504 |
| WO | 2012/128079 | 9/2012 | |

* cited by examiner

ORGANIC ELECTROLUMINESCENT ELEMENT

TECHNICAL FIELD

The invention relates to an organic electroluminescent element, which is available for various lighting devices and the like.

BACKGROUND ART

Organic electroluminescent elements are attracting attention as next-generation light sources for illumination and are actively being developed for commercialization, because those can perform surface emission and are ultra-thin, for example. Especially, research and development of a technique for high color rendering property, which is considered as one of problems in inorganic LED illumination, are actively being promoted, and various methods for the high color rendering property are proposed through various device design technical developments (e.g., see Patent literatures 1 and 2).

However, an organic electroluminescent element of changing the color rendering property by an irradiation angle to a light emission surface is not conventionally proposed. If such an organic electroluminescent element with high color rendering property in a certain direction is provided, it may be possible to properly use different organic electroluminescent elements, depending on the purpose of use or the like, and provide the most suitable lighting devices.

PRIOR ART DOCUMENTS

Patent Literature

Patent literature 1: JP 2006-287154 A
Patent literature 2: JP 2009-224274 A

SUMMARY OF THE INVENTION

Problems to be Resolved by the Invention

The present invention has been made in the light of the above-mentioned problem, and it is an object thereof to provide an organic electroluminescent element, which has high color rendering property in a wide angle region.

Means of Solving the Problems

An organic electroluminescent element according to the present invention, includes electrodes and an organic light-emitting layer that is between the electrodes. The organic light-emitting layer contains at least three colors of luminescent materials. The luminescent materials are first, second and third luminescent materials. The first luminescent material has a maximum light emission wavelength within a range of 430 nm to 480 nm. The second luminescent material has a maximum light emission wavelength within a range of 510 nm to 610 nm. The third luminescent material has a maximum light emission wavelength within a range of 580 nm to 630 nm. The organic electroluminescent element has a light emission surface. An average value of average color rendering indexes in a wide angle region of 30° to 60° with respect to a front direction of the light emission surface is higher than an average color rendering index in the front direction.

In the present invention, preferably, the organic electroluminescent element includes, as the electrodes, a reflection electrode and a transparent electrode, and the organic light-emitting layer includes a second light-emitting layer containing the second luminescent material and a third light-emitting layer containing the third luminescent material. In this case, preferably, the second and third light-emitting layers have a relationship of "$(n3 \times d3)/\lambda 3 \geq (n2 \times d2)/\lambda 2$", and a value of "$(n2 \times d2)/\lambda 2$" is in a range of 0.15 to 0.3, where "n3" denotes a refractive index of material between the reflection electrode and the third light-emitting layer, "d3" denotes a dimension between the reflection electrode and the third light-emitting layer, "$\lambda 3$" denotes the maximum light emission wavelength of the third luminescent material, "n2" denotes a refractive index of material between the reflection electrode and the second light-emitting layer, "d2" denotes a dimension between the reflection electrode and the second light-emitting layer, and "$\lambda 2$" denotes the maximum light emission wavelength of the second luminescent material.

In the present invention, preferably, at least one of the maximum light emission wavelengths of the first to third luminescent materials has a half value width of 60 nm or more.

In the present invention, preferably, the average color rendering indexes have a maximum value in a region of 40° to 60° with respect to the front direction.

In the present invention, preferably, the second and third light-emitting layers are disposed between the reflection electrode and a first light-emitting layer containing the first luminescent material.

Effect of the Invention

According to the present invention, the average value of the average color rendering indexes in the wide angle region of 30° to 60° with respect to the front direction of the light emission surface is higher than the average color rendering index in the front direction, and therefore, it is possible to provide the organic electroluminescent element having high color rendering property in the wide angle region.

EMBODIMENT FOR CARRYING OUT THE INVENTION

Hereinafter, an embodiment for carrying out the present invention will be described.

Figure 1:
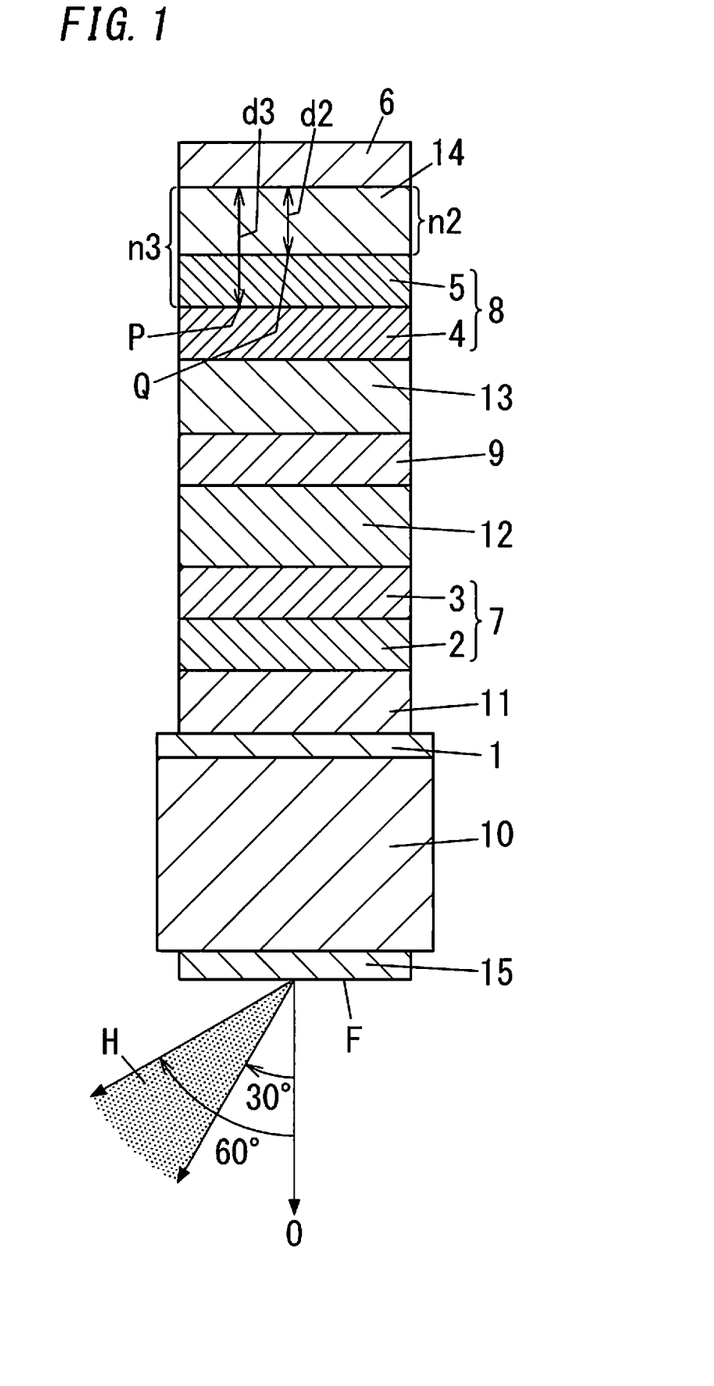
FIG. 1 is a schematic cross sectional view of one example of an organic electroluminescent element according to the present invention.

FIG. 1 shows a structure of an organic electroluminescent element according to the present embodiment, as one example. The organic electroluminescent element includes a substrate 10 and a transparent electrode 1 that is formed on a surface of the substrate 10, and further includes a first hole transport layer 11, a blue fluorescent light-emitting layer 2, a green fluorescent light-emitting layer 3, a first electron transport layer 12, an intermediate layer 9, a second hole transport layer 13, a red phosphorescent light-emitting layer 4, a green phosphorescent light-emitting layer 5, a second electron transport layer 14 and a reflection electrode 6, which are formed on the transparent electrode 1 in that order. Further, a light extraction layer 15 is formed on an opposite side of the substrate 10 from the transparent electrode 1. In the organic electroluminescent element, the blue and green fluorescent light-emitting layers 2 and 3 and the red and green phosphorescent light-emitting layers 4 and 5 are provided as an organic light-emitting layer.

The blue fluorescent light-emitting layer 2 is provided as a first light-emitting layer containing a first luminescent material. As the first luminescent material, used is a blue fluorescent luminescent material that has a maximum light emission wavelength within a range of 430 nm to 480 nm.

The green phosphorescent light-emitting layer 5 is provided as a second light-emitting layer containing a second luminescent material. As the second luminescent material, used is a green phosphorescent luminescent material that has a maximum light emission wavelength within a range of 510 nm to 610 nm.

The red phosphorescent light-emitting layer 4 is provided as a third light-emitting layer containing a third luminescent material. As the third luminescent material, used is a red phosphorescent luminescent material that has a maximum light emission wavelength within a range of 580 nm to 630 nm.

The green fluorescent light-emitting layer 3 is provided as a fourth light-emitting layer containing a fourth luminescent material. As the fourth luminescent material, used is a green fluorescent luminescent material that has a maximum light emission wavelength within a range of 460 nm to 540 nm.

Note that, although the present structure is described below as an example, the present structure is strictly one example, and the present invention is not limited to the present structure, as long as it is not against the effect of the present invention.

The substrate 10 preferably has light transmitting property. The substrate 10 may be transparent and colorless, or colored slightly. The substrate 10 may be formed like frosted glass. Examples of material for the substrate 10 include: transparent glasses, such as soda lime glass and non-alkali glass; and plastics, such as polyester resin, polyolefin resin, polyamide resin, epoxy resin and fluorine-based resin. The substrate 10 may have a film shape or a plate shape.

The transparent electrode 1 functions as an anode. The anode in the organic electroluminescent element is provided to inject holes into the organic light-emitting layer. Examples of material for the transparent electrode 1 include metal oxides, such as ITO (indium-tin oxide), $SnO_2$, ZnO and IZO (indium-zinc oxide). The transparent electrode 1 is formed by an appropriate method, such as a vacuum deposition method, a sputtering method or a coating method, using such material. A preferred thickness of the transparent electrode 1 depends on the material constituting it. However, the thickness is preferably set to 500 nm or less, and is more preferably set to be in a range of 10 nm to 200 nm.

Materials for the first and second hole transport layers 11 and 13 (hole transporting materials) are appropriately selected from a group of compounds having hole transporting properties. In this case, it is preferred that the compounds further have electron donation properties and are suitable even when subjected to radical cationization by donating electrons. Examples of the hole transporting materials include a triarylamine-based compound, an amine compound containing a carbazole group, an amine compound containing a fluorene derivative, and starburst amines (m-MTDATA). Typical examples of those compounds include polyaniline, 4,4'-bis[N-(naphthyl)-N-phenyl-amino]biphenyl(α-NPD), N,N'-bis(3-methylphenyl)-(1,1'-biphenyl)-4,4'-diamine(TPD), 2-TNATA, 4,4',4''-tris(N-(3-methylphenyl)N-phenylamino)triphenylamine(MTDATA), 4,4'-N,N'-dicarbazolebiphenyl(CBP), spiro-NPD, spiro-TPD, spiro-TAD and TNB. Examples of TDATA-based materials include 1-TMATA, 2-TNATA, p-PMTDATA and TFATA. However, the material is not limited to those, and an arbitrary hole transporting material generally known may be used. The first and second hole transport layers 11 and 13 are formed by an appropriate method, such as a deposition method.

Materials for the first and second electron transport layers 12 and 14 (electron transporting materials) are preferably compounds that are capable of transporting electrons and can provide an excellent electron injection effect to the light-emitting layer, by receiving injection of electrons from the reflection electrode 6. In addition, the materials for the first and second electron transport layers 12 and 14 (electron transporting materials) are preferably compounds that are capable of inhibiting holes from moving toward the first and second electron transport layers 12 and 14, and are excellent in thin film formability. Examples of the electron transporting material include $Alq_3$, an oxadiazole derivative, starburst oxadiazole, a triazole derivative, a phenyl quinoxaline derivative, and a silole derivative. Concrete examples of the electron transporting material include fluorene, bathophenanthroline, bathocuproine, anthraquinodimethane, diphenoquinone, oxazole, oxadiazole, triazole, imidazole, anthraquinodimethane, 4,4'-N,N'-dicarbazolebiphenyl (CBP), a compound including any of those, a metal-complex compound, and a nitrogen-containing five-membered ring derivative. Concrete examples of the metal-complex compound include tris(8-hydroxyquinolinate)aluminum, tri(2-methyl-8-hydroxyquinolinate)aluminum, tris(8-hydroxyquinolinate)gallium, bis(10-hydroxybenzo[h]quinolinate) beryllium, bis(10-hydroxybenzo[h]quinolinate) zinc, bis(2-methyl-8-quinolinate)(o-cresolate)gallium, bis(2-methyl-8-quinolinate)(1-naphtholato)aluminum, and bis(2-methyl-8-quinolinate)-4-phenylphenolate, although not limited to them. Examples of the nitrogen-containing five-membered ring derivative preferably include oxazole, thiazole, oxadiazole, thiadiazole, and a triazole derivative. Concrete examples of the nitrogen-containing five-membered ring derivative include 2,5-bis(1-phenyl)-1,3,4-oxazole, 2,5-bis(1-phenyl)-1,3,4-thiazole, 2,5-bis(1-phenyl)-1,3,4-oxadiazole, 2-(4'-tert-butylphenyl)-5-(4''-biphenyl) 1,3,4-oxadiazole, 2,5-bis(1-naphthyl)-1,3,4-oxadiazole, 1,4-bis[2-(5-phenylthiadiazolyl)]benzene, 2,5-bis(1-naphthyl)-1,3,4-triazole, and 3-(4-biphenylyl)-4-phenyl-5-(4-t-butylphenyl)-1,2,4-triazole, although not limited to them. In addition, the examples of the electron transporting material also include a polymer material that is used for a polymer organic electroluminescent element. Examples of the polymer material include polyparaphenylene, a polyparaphenylene derivative, fluorene, and a fluorene derivative. Thicknesses of the first and second electron transport layers 12 and 14 are in a range of 10 nm to 300 nm for example, although in particular not limited to it. The first and second electron transport layers 12 and 14 are formed by an appropriate method, such as a deposition method.

The reflection electrode 6 functions as an cathode. The cathode in the organic electroluminescent element is provided to inject electrons into the light-emitting layer. The reflection electrode 6 is preferably formed of material with a low work function, such as metal, alloy, conductive compound or a mixture thereof. Examples of the material for the reflection electrode 6 include Al, Ag and MgAg. The reflection electrode 6 may be formed of Al/Al$_2$O$_3$ mixture or the like. The reflection electrode 6 is formed by an appropriate method, such as a vacuum deposition method or a sputtering method, using such material. A preferred thickness of the reflection electrode 6 depends on the material constituting it. However, the thickness is preferably set to 500 nm or less, and is more preferably set to be in a range of 20 nm to 200 nm.

The light extraction layer 15 may be formed by stacking a light-scattering film or a microlens film on an opposite side of the substrate 10 from the transparent electrode 1 in order to improve light diffusing property.

Here, in the organic electroluminescent element according to the present invention, it is possible to realize high color rendering property by combining luminescent materials respectively having appropriate maximum light emission wavelengths (light emission peak wavelengths), as described below.

The organic light-emitting layers (blue and green fluorescent light-emitting layers 2 and 3, and red and green phosphorescent light-emitting layers 4 and 5) each may be formed of organic material (host material) doped with luminescent material (dopant). Examples of the host material include the electron transporting material, the hole transporting material, and material with both of electron transporting property and hole transporting property. As the host material, the electron transporting material and hole transporting material may be used together.

The blue fluorescent luminescent material for the blue fluorescent light-emitting layer 2 is not limited in particular and arbitrary fluorescent luminescent material may be used, as long as it can emit light with high efficiency, using TTF phenomenon. The blue fluorescent luminescent material has a maximum light emission wavelength within a range of 430 nm to 480 nm. It is possible to realize a white organic electroluminescent element with a high average color rendering index Ra and high performance, by using the short wavelength blue fluorescent luminescent material having the maximum light emission wavelength within the range of 430 nm to 480 nm, as described above.

Examples of the blue fluorescent luminescent material for the blue fluorescent light-emitting layer 2 include 1,4,7,10-tetra-tertiary-butylperylene (TBP, a maximum light emission wavelength of 455 nm), and 4,4'-bis(9-ethyl-3-carbazolvinylene)-1,1'-biphenyl (BCzVBi, a maximum light emission wavelength of 470 nm). Examples of the host material for the blue fluorescent light-emitting layer 2 include 2-t-butyl-9,10-di(2-naphtyl)anthracene (TBADN), 9,10-di(2-naphtyl)anthracene (ADN), bis(9,9-diallyfluorene) (BDAF). A concentration of the blue fluorescent luminescent material is preferably in a range of 1 to 30 mass % with respect to the total mass of the blue fluorescent light-emitting layer 2.

The green phosphorescent luminescent material for the green phosphorescent light-emitting layer 5 is not limited in particular and arbitrary phosphorescent luminescent material may be used. However, in view of lifetime property, a maximum light emission wavelength of the green phosphorescent luminescent material is preferably longer than that of the green fluorescent luminescent material. Specifically, used is preferably the green phosphorescent luminescent material having a maximum light emission wavelength within a range of 510 nm to 610 nm. The green phosphorescent luminescent material can cover a light emission spectrum between light emission spectrums of the green fluorescent luminescent material and the red phosphorescent luminescent material, by using the green phosphorescent luminescent material having the maximum light emission wavelength within this range. Therefore, it is possible to more enhance the color rendering property.

Examples of the green phosphorescent luminescent material for the green phosphorescent light-emitting layer 5 include bis(2-2'-benzothienyl)-pyridinate-N,C3iridium (acetylacetonate) (Bt$_2$Ir(acac), a maximum light emission wavelength of 566 nm), and tris(2-phenylpyridine)indium (Ir(ppy)$_3$, a maximum light emission wavelength of 514 nm). Examples of the host material for the green phosphorescent light-emitting layer 5 include 4,4'-N,N'-dicarbazole-biphenyl (CBP), 4,4"-di(N-carbazolyl)-2',3',5',6'-tetraphenyl-p-terphenyl (CzTT), 4,4',4"-tris(N-carbazolyl)-triphenylamine (TCTA), 1,3-bis(carbazole-9-yl)benzene (mCP), and 4,4'-N,N'-dicarbazole-2,2'-dimethyl-biphenyl (CDBP). A concentration of the green phosphorescent luminescent material is preferably in a range of 1 to 40 mass % with respect to the total mass of the green phosphorescent light-emitting layer 5.

The red phosphorescent luminescent material for the red phosphorescent light-emitting layer 4 is not limited in particular and arbitrary phosphorescent luminescent material may be used. However, in view of high color rendering property, used is preferably phosphorescent luminescent material having a maximum light emission wavelength within a range of 580 nm to 630 nm. It is possible to realize a white organic electroluminescent element with a high special color rendering index R9 (red) and high performance, by using the long wavelength red phosphorescent luminescent material having the maximum light emission wavelength within the range of 580 nm to 630 nm, as described above.

Examples of the red phosphorescent luminescent material for the red phosphorescent light-emitting layer 4 include tris(1-phenylisoquinoline)iridium(III) (Ir(piq)$_3$, a maximum light emission wavelength of 629 nm), and bis(1-phenylisoquinoline)iridiumacetylacetonate (Pq$_2$Ir(acac), a maximum light emission wavelength of 605 nm). Examples of the host material for the red phosphorescent light-emitting layer 4 include CBP(4,4'-N,N'-dicarbazolebiphenyl), CzTT, TCTA, mCP, and CDBP. A concentration of the red phosphorescent luminescent material is preferably in a range of 1 to 40 mass % with respect to the total mass of the red phosphorescent light-emitting layer 4.

The green fluorescent luminescent material for the green fluorescent light-emitting layer 3 is not limited in particular and arbitrary fluorescent luminescent material may be used. However, in view of lifetime property, a maximum light emission wavelength of the green fluorescent luminescent material is preferably shorter than that of the green phosphorescent luminescent material. Specifically, used is preferably the green fluorescent luminescent material having a maximum light emission wavelength within a range of 460 nm to 540 nm. The green fluorescent luminescent material can cover a light emission spectrum between light emission spectrums of the blue fluorescent luminescent material and the green phosphorescent luminescent material, by using the green fluorescent luminescent material having the maximum light emission wavelength within this range. Therefore, it is possible to more enhance the color rendering property.

Examples of the green fluorescent luminescent material for the green fluorescent light-emitting layer 3 include triphenylamine (TPA, a maximum light emission wavelength of 530 nm). Examples of the host material for the green fluorescent light-emitting layer 3 include tris(8-oxoquinoline)aluminum(III) (Alq$_3$), ADN, and BDAF. A concentration of the green fluorescent luminescent material is preferably in a range of 1 to 20 mass % with respect to the total mass of the green fluorescent light-emitting layer 3.

As described above, used are two types of green luminescent materials (the green fluorescent luminescent material and the green phosphorescent luminescent material) having different maximum light emission wavelength ranges, and accordingly, it is possible to efficiently realize adjustment of an emission color, and easily provide high color rendering, and high efficiency.

The organic light-emitting layers (blue and green fluorescent light-emitting layers 2 and 3, and red and green phosphorescent light-emitting layers 4 and 5) each may be formed by an appropriate method, such as a dry-type process (e.g., a vacuum deposition method or a transfer method) or a wet-type process (e.g., a spin coating method, a spray coating method, a die coating method or a gravure printing method).

The organic electroluminescent element shown in FIG. 1 has a multi-unit structure in which a first light emission unit 7 and a second light emission unit 8 are stacked via the intermediate layer 9 therebetween.

The first light emission unit 7 includes the blue and green fluorescent light-emitting layers 2 and 3 that are stacked. Both of the blue and green fluorescent light-emitting layers 2 and 3 contain fluorescent luminescent materials.

Regarding light to be emitted from the first light emission unit 7, a phenomenon (TTF: triplet-triplet fusion) is utilized, where a singlet exciton is generated by collision and fusion of two triplet excitons. The first light emission unit 7, utilizing the TTF phenomenon, is formed of the above-mentioned blue and green fluorescent luminescent materials. It is possible to enhance the efficiency of the first light emission unit 7 by utilizing the TTF phenomenon, as described above, and further enhance the efficiency as a white element, by combining the first light emission unit 7 with the second light emission unit 8. In addition, it is possible to adjust a light emission color temperature while keeping high efficiency, by providing the first light emission unit 7 as a stacking structure having different emission colors, as described above. For example, if the first light emission unit 7 is a light-emitting layer with a single emission color, which includes only the blue fluorescent light-emitting layer 2, intensity of blue light emission may be too high to realize a white element with a low color temperature. On the other hand, in the case where the blue and green fluorescent light-emitting layers 2 and 3 are stacked as described above, the intensity ratio of the blue light emission is increased by increasing a film thickness of the blue fluorescent light-emitting layer 2, in order to realize a white element with a high color temperature, and the intensity ratio of the green light emission is increased by increasing a film thickness of the green fluorescent light-emitting layer 3, in order to realize a white element with a low color temperature. Therefore, it is possible to easily adjust the light emission color without reducing the efficiency. The first light emission unit 7 mentioned here is not limited in particular, as long as it utilizes the TTF phenomenon. However, the first light emission unit 7 is preferably configured to emit light at internal quantum efficiency of 25% or more. In this case, it is possible to realize both of high efficiency and long lifetime. In order to effectively attain and utilize the TTF phenomenon, a triplet energy level of the electron transporting material for the first electron transport layer 12 is preferably higher than that of material contained in the first light emission unit 7.

The second light emission unit 8 includes the green and red phosphorescent light-emitting layers 5 and 4 that are stacked. Both of the green and red phosphorescent light-emitting layers 5 and 4 contain phosphorescent luminescent materials.

The intermediate layer 9 has a function of electrically connecting the two light emission units in series with each other. The intermediate layer 9 preferably has high transparency and high thermal and electrical stability. The intermediate layer 9 may include a layer of forming an equipotential surface or a charge generating layer, for example. Examples of material for the layer of forming the equipotential surface or the charge generating layer include: metal thin films, such as Ag, Au and Al; metal oxide, such as vanadium oxide, molybdenum oxide, rhenium oxide and tungsten oxide; transparent conductive films, such as ITO, IZO, AZO, GZO, ATO and SnO$_2$; a laminate including so-called an n-type semiconductor and a p-type semiconductor; a laminate including a metal thin film or a transparent conductive film, and one or both of the n-type and p-type semiconductors; a mixture of the n-type and p-type semiconductors; and a mixture of metal, and one or both of the n-type and p-type semiconductors. The n-type and p-type semiconductors are not limited in particular, and things selected as needed may be used. The n-type and p-type semiconductors may be formed of inorganic material or organic material. Alternatively, the n-type and p-type semiconductors may be formed of: a mixture of the organic material, and metal; a combination of the organic material, and metal oxide; or a combination of the organic material, and organic acceptor/donor material or inorganic acceptor/donor material. Alternatively, the intermediate layer 9 may be formed of BCP:Li, ITO, NPD:MoO$_3$, or Liq:Al. BCP denotes 2,9-dimethyl-4,7-diphenyl-1,10-phenanthroline. For example, the intermediate layer 9 may have two layer structure in which a first layer as BCP:Li is disposed on the side of the anode and a second layer as ITO is disposed on the side of the cathode. The intermediate layer 9 preferably has a layer structure, such as Alq3/Li$_2$O/HAT-CN6, Alq3/Li$_2$O, or Alq3/Li$_2$O/Alq3/HAT-CN6.

Material physical property values, such as ionization potential, electron affinity and a triplet energy level, required for material to enhance performance of the first light emission unit 7 are different from those required for material to enhance performance of the second light emission unit 8. For this reason, it is possible to individually select respective materials corresponding to the first and second light emission units 7 and 8, by separating the first light emission unit 7 from the second light emission unit 8 by the intermediate layer 9 therebetween. Therefore, it is effective in enhancing the efficiency and lifetime. In addition, the multi-unit structure is used, which is capable of disposing the first light emission unit 7 having a light emission spectrum within a relatively-short wavelength range, separately from the second light emission unit 8 having a light emission spectrum within a relatively-long wavelength range, by the intermediate layer 9 therebetween. Therefore, it is possible to facilitate an optical design, and provide high color rendering, high efficiency, long lifetime and high luminance, and reduce view angle dependency of chromaticity.

The organic electroluminescent element of the present embodiment with the above-mentioned structure is characterized in that an average value of average color rendering indexes in a wide angle region of 30° to 60° with respect to a front direction of the light emission surface F is higher than an average color rendering index in the front direction. The "light emission surface F" mentioned here means a surface (outer surface) of a part, through which light emitted from the organic light-emitting layer is taken out toward the outside of the organic electroluminescent element. Specifically, an outer surface of the light extraction layer 15 (a surface on an opposite side of the light extraction layer 15 from the substrate 10) corresponds to the light emission surface F. In a case where the light extraction layer 15 is not provided, an outer surface of the substrate 10 (a surface on an opposite side of the substrate 10 from the transparent electrode 1) may correspond to a light emission surface. In a case where the light extraction layer 15 and the substrate 10 are not provided, an outer surface of the transparent electrode 1 (a surface on an opposite side of the transparent electrode 1 from the organic light-emitting layer) may correspond to a light emission surface. The "front direction of the light emission surface F" mentioned here means a vertical direction to the light emission surface (i.e., a normal direction). The "average color rendering index" mentioned here is defined in JIS Z 8726, and measured according to JIS Z 8724. The "wide angle region of 30° to 60° with respect to the front direction" mentioned here means a region between a position of a direction inclined by 300 and a position of a direction inclined by 60° clockwise (or counterclockwise) from the front direction of the light emission surface F. The "average value of average color rendering indexes" means an arithmetical mean value of measurement values that are obtained by measuring respective average color rendering indexes corresponding to plural angles (e.g., 30°, 40°, 50° and 60°) in the above-mentioned wide angle region.

Figure 2:
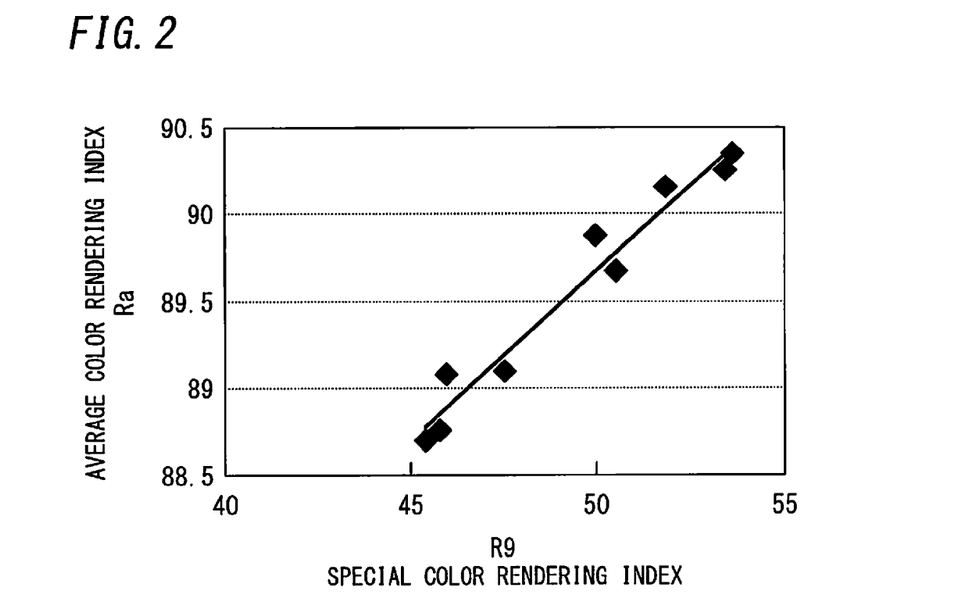
FIG. 2 is a graph illustrating a correlation between an average color rendering index Ra and a special color rendering index R9.

The first, second and third luminescent materials with the maximum light emission wavelengths described above are used, and further, the average value of average color rendering indexes Ra in the wide angle region H of 30° to 60° with respect to the front direction O of the light emission surface F is higher than an average color rendering index Ra in the front direction O, and accordingly, the organic electroluminescent element can have high color rendering property in the wide angle region H rather than in the front direction O. In other words, using of the luminescent materials having the maximum light emission wavelengths in the above-mentioned wavelength ranges is effective in enhancing the color rendering property of the organic electroluminescent element. In such an organic electroluminescent element, there is a strong correlation between an average color rendering index Ra and a special color rendering index R9, as shown in FIG. 2. Here, R9 denotes a red color rendering index. Increasing of intensity of red light emission (intensity of light emission from the third luminescent material) in the wide angle region H is effective in realizing high R9 in the wide angle region H.

The reason that high color rendering property by oblique irradiation of light is required is for example as follows. An organic electroluminescent element is a diffusion light source, and relatively low in directivity. Regarding illumination in a shop, it is important to radiate light from an oblique direction for obtaining a three-dimensional effect of goods. Irradiation of light from just above the goods may cause a problem that a delicate three-dimensional effect is lost, depending on shapes of the irradiated goods. Also, irradiation of light from just beside may cause a problem that a three-dimensional effect is provided too strongly to correctly grasp shapes of the irradiated goods. Regarding illumination in a museum, it is required to examine a position of a light source, or an exhibit (put in a picture frame with glass, or a glass case) for preventing that appreciation or observation is obstructed by the light source being reflected on a lustrous screen due to specular reflection of light or by background being reflected on a glass surface. In other words, it is required to locate the light source at a position where the specular reflection of light does not occur. As a result, it is important to radiate light from an oblique direction.

For setting the average value of average color rendering indexes Ra in the wide angle region H of 30° to 60° with respect to the front direction O of the light emission surface F to be higher than an average color rendering index Ra in the front direction O as described above, it is preferred that the third light-emitting layer (being the red phosphorescent light-emitting layer 4) and the second light-emitting layer (being the green phosphorescent light-emitting layer 5) have a relationship of "(n3×d3)/λ3≥(n2×d2)/λ2", and regarding the second light-emitting layer, a value of "(n2×d2)/λ2" is in a range of 0.15 to 0.3. Thereby, it is possible to more increase, in the wide angle region H, the intensity of red light emission (intensity of light emission from the third luminescent material), compared with the intensity of green light emission (intensity of light emission from the second luminescent material). Here, "n3" denotes a refractive index of material between the reflection electrode 6 and the third light-emitting layer, "d3" denotes a dimension between the reflection electrode 6 and the third light-emitting layer, "λ3" denotes the maximum light emission wavelength of the third luminescent material, "n2" denotes a refractive index of material between the reflection electrode 6 and the second light-emitting layer, "d2" denotes a dimension between the reflection electrode 6 and the second light-emitting layer, and "λ2" denotes the maximum light emission wavelength of the second luminescent material. The "between the reflection electrode 6 and the third light-emitting layer" mentioned here means "between a surface of the reflection electrode 6 opposing the third light-emitting layer (an interface between the reflection electrode 6 and the electron transport layer 14), and a light emission position P of the third light-emitting layer". In many cases, the light emission position P of the third light-emitting layer is on an interface between the second and third light-emitting layers. However, the light emission position P is not limited to this. Light may be emitted at an arbitrary position of the third light-emitting layer in its thickness direction (e.g., a center of the third light-emitting layer in its thickness direction). Also, the "between the reflection electrode 6 and the second light-emitting layer" mentioned here means "between a surface of the reflection electrode 6 opposing the second light-emitting layer (the interface between the reflection electrode 6 and the electron transport layer 14), and a light emission position Q of the second light-emitting layer. In many cases, the light emission position Q of the second light-emitting layer is on an interface between the second light-emitting layer and the electron transport layer 14. However, the light emission position Q is not limited to this. Light may be emitted at an arbitrary position of the second light-emitting layer in its thickness direction (e.g., a center of the second light-emitting layer in its thickness direction).

A value of the above-mentioned "n3" can be adjusted through a type of the electron transporting material for the electron transport layer 14, types of the host materials for the second and third light-emitting layers, or the like. A value of the above-mentioned "d3" can be adjusted through a thickness of the electron transport layer 14, thicknesses of the second and third light-emitting layers, or the like. A value of the above-mentioned "λ3" can be adjusted through a type of the third luminescent material, or the like. A value of the above-mentioned "n2" can be adjusted through a type of the electron transporting material for the electron transport layer 14, a type of the host material for the second light-emitting layer, or the like. A value of the above-mentioned "d2" can be adjusted through a thickness of the electron transport layer 14, a thickness of the second light-emitting layer, or the like. A value of the above-mentioned "λ2" can be adjusted through a type of the second luminescent material, or the like. In a case where plural layers are between the reflection electrode 6 and the third light-emitting layer, the "n3" is an arithmetical mean value of refractive indexes of the plural layers, and similarly, in a case where plural layers are between the reflection electrode 6 and the second light-emitting layer, the "n2" is an arithmetical mean value of refractive indexes of the plural layers.

Regarding the above-mentioned organic electroluminescent element, in a case where measured are average color rendering indexes Ra between a position of a direction inclined by 0° and a position of a direction inclined by 90° clockwise (or counterclockwise) from the front direction O of the light emission surface F, it is preferred that the average color rendering indexes Ra have a maximum value in a region of 40° to 60° with respect to the front direction O. Thereby, it is possible to suitably utilize the organic electroluminescent element, for illumination intended to radiate light from an oblique direction.

In the above-mentioned organic electroluminescent element, it is preferred that at least one of the maximum light emission wavelengths of the first to third luminescent materials has a half value width of 60 nm or more. When the half value width is wide as above, it is possible to obtain a broad white spectrum, and it is effective in enhancing color rendering property. It is especially preferred that the maximum light emission wavelength (a light emission spectrum) of the green phosphorescent luminescent material, which is the second luminescent material of the first to third luminescent materials, has a half value width of 60 nm or more. In addition, it is more preferred that the maximum light emission wavelength of the green phosphorescent luminescent material, which is the second luminescent material, has a half value width of 70 nm or more (its upper limit is about 120 nm). It is possible to suitably cover a wide wavelength range between a short wavelength blue fluorescent light emission spectrum and a long wavelength red phosphorescent light emission spectrum by using the green phosphorescent luminescent material with the relatively-long half value width of the maximum light emission wavelength (light emission spectrum), which is 60 nm or more, and it is effective in enhancing color rendering property. As above, when the half value width of the green phosphorescent light emission spectrum is 60 nm or more, it is possible to obtain high color rendering property, regarding both of an average color rendering index Ra and a special color rendering index R9 (red). The color rendering property depends on a spectral shape, and the above is one example. However, it can be said that the half value width of the green phosphorescent light emission spectrum has a significant influence on the color rendering property, and increasing of the half value width of the green phosphorescent light emission spectrum is effective in enhancing the color rendering property. Also, it is preferred that the maximum light emission wavelength (a light emission spectrum) of the green fluorescent luminescent material, which is the fourth luminescent material, has a half value width of 60 nm or more. As a matter of course, when the light emission spectrums of both of the green fluorescent and green phosphorescent luminescent materials have half value widths of 60 nm or more, it is more effective in enhancing the color rendering property. Note that, the maximum light emission wavelength of the blue fluorescent luminescent material, which is the first luminescent material, may have a half value width of 60 nm or more. The maximum light emission wavelength of the red phosphorescent luminescent material, which is the second luminescent material, may have a half value width of 60 nm or more. Further, the maximum light emission wavelengths of two or three of the first to third luminescent materials, may have half value widths of 60 nm or more.

In the above-mentioned organic electroluminescent element, it is preferred that the first light emission unit 7 is disposed on the side of the transparent electrode 1, and the second light emission unit 8 is disposed on the side of the reflection electrode 6, as shown in FIG. 1, in view of enhancing the efficiency and reducing the angle dependency of chromaticity. A light emission unit on the side of the reflection electrode 6 tends to have a small loss due to influence by interference, compared with a light emission unit on the side of the transparent electrode 1. The light emission unit on the side of the reflection electrode 6 tends to have high light extraction efficiency, compared with the light emission unit on the side of the transparent electrode 1. Therefore, it is possible to enhance the performance, the color rendering property and the efficiency, by disposing the second light emission unit 8 with high internal quantum efficiency on the side of the reflection electrode 6 in which the light extraction efficiency is relatively high.

EXAMPLES

Example 1

An organic electroluminescent element was made, which had a multi-unit structure as shown in FIG. 1. Specially, a transparent electrode 1 was made by forming an ITO film with a thickness of 130 nm on a substrate 10 (glass substrate). Further, on the transparent electrode 1, formed were a first hole transport layer 11, a blue fluorescent light-emitting layer 2 (containing BCzVBi as blue fluorescent luminescent material), a green fluorescent light-emitting layer 3 (containing TPA as green fluorescent luminescent material) and a first electron transport layer 12 (CBP) in that order by a deposition method, each of which had a thickness of 5 nm to 60 nm. Then, an intermediate layer 9 with a thickness of 15 nm was stacked, which had a layer structure of $Alq3/Li_2O/Alq3/HAT$-$CN6$. Then, formed were a second hole transport layer 13, a red phosphorescent light-emitting layer 4 (containing $Ir(piq)_3$ as red phosphorescent luminescent material), a green phosphorescent light-emitting layer 5 (containing $Bt_2Ir(acac)$ as green phosphorescent luminescent material) and a second electron transport layer 14 in that order, each of which had a thickness of 50 nm at maximum. Then, a reflection electrode 6 as an Al film was formed. Note that, a light extraction layer 15 was formed by stacking a light-scattering film on a surface on an opposite side of the substrate 10 from the transparent electrode 1.

Here, a refractive index "n3" of material between the reflection electrode 6 and a third light-emitting layer was 1.73. A dimension "d3" between the reflection electrode 6 and the third light-emitting layer was 100 nm. A maximum light emission wavelength "λ3" of third luminescent material was 610 nm. A refractive index "n2" of material between the reflection electrode 6 and a second light-emitting layer was 1.67. A dimension "d2" between the reflection electrode 6 and the second light-emitting layer was 70 nm. A maximum light emission wavelength "λ2" of second luminescent material was 570 nm. Accordingly, the third light-emitting layer (being the red phosphorescent light-emitting layer 4) and the second light-emitting layer (being the green phosphorescent light-emitting layer 5) had a relationship of "(n3×d3)/λ3≥(n2×d2)/λ2", and regarding the second light-emitting layer, a value of "(n2×d2)/λ2" was in a range of 0.15 to 0.3. A half value width of the green phosphorescent luminescent material was 67 nm.

Example 2

For adjustment of an emission color, an organic electroluminescent element was made by the same method as the Example 1 other than film thicknesses and dope concentrations of a red phosphorescent light-emitting layer 4 and a green phosphorescent light-emitting layer 5, and a film thickness of a second electron transport layer 14.

Here, a refractive index "n3" of material between a reflection electrode 6 and a third light-emitting layer was 1.70. A dimension "d3" between the reflection electrode 6 and the third light-emitting layer was 80 nm. A maximum light emission wavelength "23" of third luminescent material was 610 nm. A refractive index "n2" of material between the reflection electrode 6 and a second light-emitting layer was 1.66. A dimension "d2" between the reflection electrode 6 and the second light-emitting layer was 60 nm. A maximum light emission wavelength "λ2" of second luminescent material was 570 nm. Accordingly, the third light-emitting layer (being the red phosphorescent light-emitting layer 4) and the second light-emitting layer (being the green phosphorescent light-emitting layer 5) had a relationship of "(n3×d3)/λ3≥(n2×d2)/λ2", and regarding the second light-emitting layer, a value of "(n2×d2)/λ2" was in a range of 0.15 to 0.3. A half value width of the green phosphorescent luminescent material was 67 nm.

Figure 3:
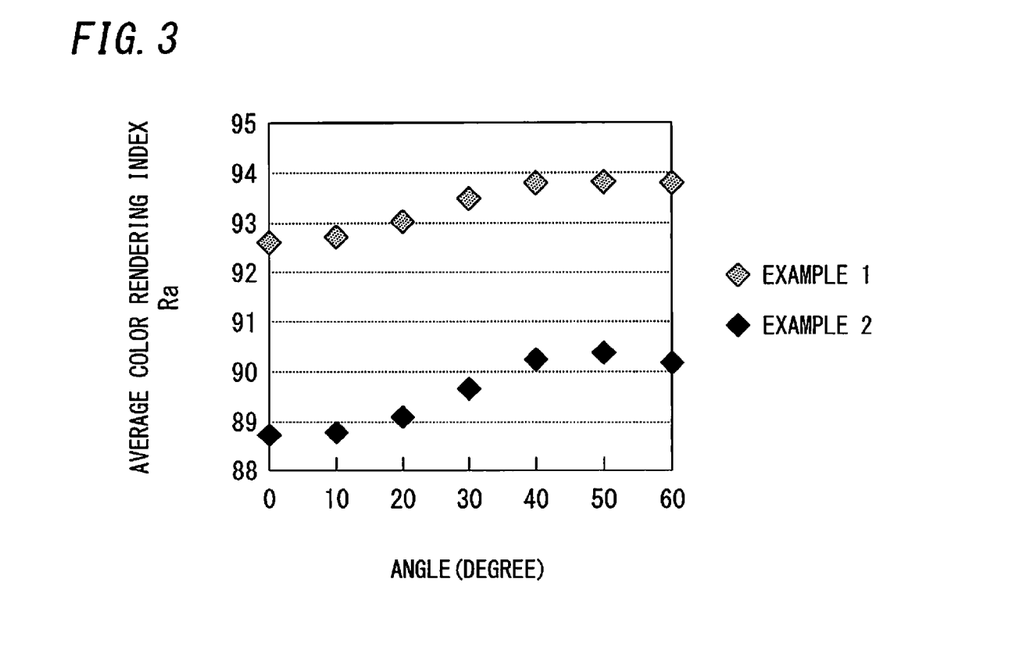
FIG. 3 is graph illustrating measurement results of average color rendering indexes in Examples 1 and 2.

Regarding the organic electroluminescent elements of the Examples 1 and 2 as above, average color rendering indexes Ra were measured while changing an angle by 100, within a range between a direction inclined by 0° (i.e., a front direction) and a direction inclined by 60° with respect to the front direction. The measurement results are shown by a graph of FIG. 3. As can be seen from this graph, in the Example 1, an average value (about 93.7) of average color rendering indexes Ra in a wide angle region of 30° to 60° with respect to a front direction of a light emission surface F was higher than an average color rendering index Ra (about 92.5) in the front direction. The average color rendering indexes Ra had a maximum value at about 40° with respect to the front direction. In the Example 2, an average value (about 90.1) of average color rendering indexes Ra in a wide angle region of 30° to 60° with respect to a front direction of a light emission surface F was higher than an average color rendering index Ra (about 88.7) in the front direction. The average color rendering indexes Ra had a maximum value at about 50° with respect to the front direction.

Figure 4:
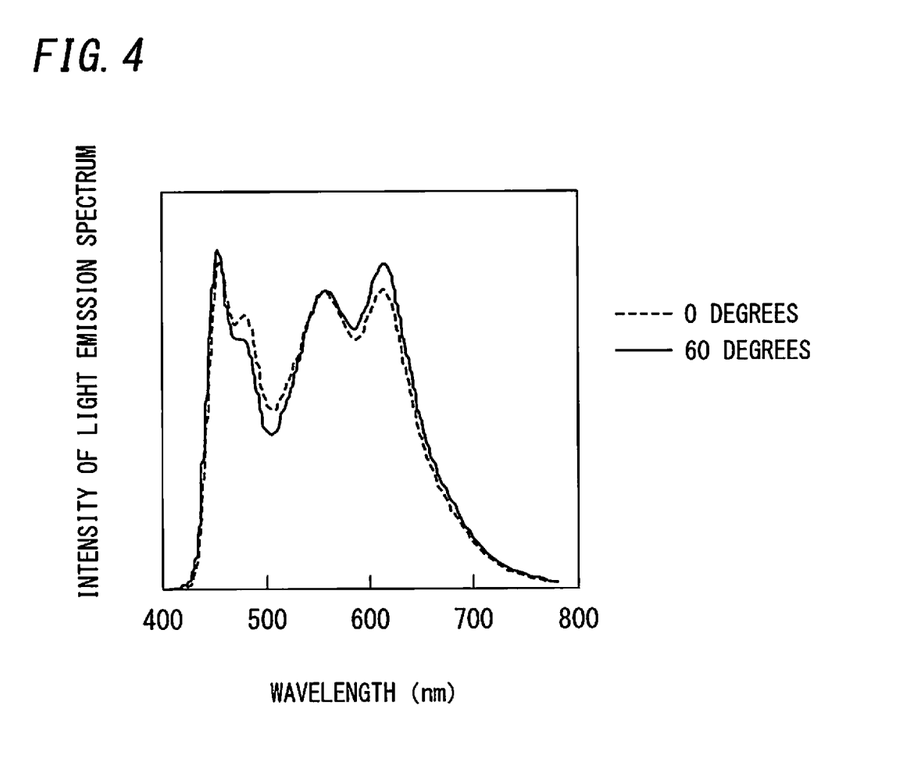
FIG. 4 is an explanatory diagram illustrating a measurement result of a light emission spectrum in Example 1.

FIG. 4 shows a light emission spectrum at 0° and a light emission spectrum at 600 with respect to the front direction of the light emission surface F in the Example 1. As can be seen from the light emission spectrums, intensity of red light emission at 600 is higher than that at 0° (near a wavelength of 610 nm). Therefore, in the wide angle region H, a special color rendering index R9 is high and accordingly, an average color rendering index Ra is also high, and the organic electroluminescent element has high color rendering property in the wide angle region H.

Comparative Example 1

An organic electroluminescent element was made by the same method as the Example 1 other than, regarding phosphorescent light-emitting layers, a green light-emitting layer and a red light-emitting layer being stacked in that order (i.e., in the reverse order of the Example 1).

Here, a refractive index "n3" of material between a reflection electrode 6 and a third light-emitting layer was 1.71. A dimension "d3" between the reflection electrode 6 and the third light-emitting layer was 80 nm. A maximum light emission wavelength "λ3" of third luminescent material was 610 nm. A refractive index "n2" of material between the reflection electrode 6 and a second light-emitting layer was 1.78. A dimension "d2" between the reflection electrode 6 and the second light-emitting layer was 100 nm. A maximum light emission wavelength "λ2" of second luminescent material was 570 nm. Accordingly, the third light-emitting layer (being a red phosphorescent light-emitting layer 4) and the second light-emitting layer (being a green phosphorescent light-emitting layer 5) had a relationship of "(n3×d3)/λ3<(n2×d2)/λ2".

Regarding the organic electroluminescent element of the Comparative Example 1 as above, average color rendering indexes Ra were measured while changing an angle by 100, within a range between a direction inclined by 0° (i.e., a front direction) and a direction inclined by 60° with respect to the front direction. As a result, an average color rendering index Ra (about 91) in a front direction of a light emission surface F was higher than an average value (about 87) of average color rendering indexes Ra in a wide angle region of 30° to 60° with respect to the front direction.

EXPLANATION OF REFERENCES

1 Electrode (transparent electrode)
2 Organic light-emitting layer (first light-emitting layer)
4 Organic light-emitting layer (third light-emitting layer)
5 Organic light-emitting layer (second light-emitting layer)
6 Electrode (reflection electrode)
F Light emission surface
H Wide angle region
n3 Refractive index of material between reflection electrode and third light-emitting layer
d3 Dimension between reflection electrode and third light-emitting layer
n2 Refractive index of material between reflection electrode and second light-emitting layer
d2 Dimension between reflection electrode and second light-emitting layer

The invention claimed is:
1. An organic electroluminescent element, comprising:
a reflection electrode;
a transparent electrode; and
an organic light-emitting layer that is between the reflection electrode and the transparent electrode,
the organic light-emitting layer containing at least three colors of luminescent materials, the luminescent materials being first, second and third luminescent materials, the first luminescent material having a maximum light emission wavelength within a range of 430 nm to 480 nm, the second luminescent material having a maximum light emission wavelength within a range of 510 nm to 610 nm, the third luminescent material having a maximum light emission wavelength within a range of 580 nm to 630 nm,
the organic electroluminescent element having a light emission surface, an average value of average color rendering indexes in a wide angle region of 30° to 60° with respect to a front direction of the light emission surface being higher than an average color rendering index in the front direction, wherein the organic light-emitting layer comprises a first light-emitting layer containing the first luminescent material, a second light-emitting layer containing the second luminescent material and a third light-emitting layer containing the third luminescent material, wherein the second and third light-emitting layers are disposed between the reflection electrode and the first light-emitting layer, and wherein the second and third light-emitting layers have a relationship of "$(n3 \times d3)/\lambda 3 \geq (n2 \times d2)/\lambda 2$", and a value of "$(n2 \times d2)/\lambda 2$" is in a range of 0.15 to 0.3, where "n3" denotes a refractive index of material between the reflection electrode and the third light-emitting layer, "d3" denotes a dimension between the reflection electrode and the third light-emitting layer, "$\lambda 3$" denotes the maximum light emission wavelength of the third luminescent material, "n2" denotes a refractive index of material between the reflection electrode and the second light-emitting layer, "d2" denotes a dimension between the reflection electrode and the second light-emitting layer, and "$\lambda 2$" denotes the maximum light emission wavelength of the second luminescent material.

2. The organic electroluminescent element according to claim 1, wherein the average color rendering indexes have a maximum value in a region of 40° to 60° with respect to the front direction.

3. The organic electroluminescent element according to claim 1,
wherein the average color rendering indexes have a maximum value in a region of 40° to 60° with respect to the front direction.

4. The organic electroluminescent element according to claim 1, wherein at least one of the maximum light emission wavelengths of the first to third luminescent materials has a half value width of 60 nm or more.

5. The organic electroluminescent element according to claim 4, wherein the average color rendering indexes have a maximum value in a region of 40° to 60° with respect to the front direction.

6. The organic electroluminescent element according to claim 1,
wherein at least one of the maximum light emission wavelengths of the first to third luminescent materials has a half value width of 60 nm or more.

7. The organic electroluminescent element according to claim 6, wherein the average color rendering indexes have a maximum value in a region of 40° to 60° with respect to the front direction.

* * * * *